(12) United States Patent
Brown et al.

(10) Patent No.: US 9,274,277 B2
(45) Date of Patent: Mar. 1, 2016

(54) WAVEGUIDE DEVICES WITH SUPPORTING ANCHORS

(71) Applicant: INTERNATIONAL BUSINESS MACHINES CORPORATION, Armonk, NY (US)

(72) Inventors: Brennan J. Brown, Burlington, VT (US); James R. Elliott, Richmond, VT (US); Qizhi Liu, Lexington, MA (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/278,689

(22) Filed: May 15, 2014

(65) Prior Publication Data

US 2015/0331183 A1 Nov. 19, 2015

(51) Int. Cl.
| | |
|---|---|
| G02B 6/12 | (2006.01) |
| G02B 6/125 | (2006.01) |
| G02B 6/132 | (2006.01) |
| G02B 6/136 | (2006.01) |
| H01L 31/0232 | (2014.01) |
| H01L 33/58 | (2010.01) |

(52) U.S. Cl.
CPC ............... *G02B 6/125* (2013.01); *G02B 6/132* (2013.01); *G02B 6/136* (2013.01); *H01L 31/02327* (2013.01); *H01L 33/58* (2013.01)

(58) Field of Classification Search
CPC .... G02B 6/43; G02B 6/12004; G02B 6/4214; G02B 6/136; B82Y 20/00; H01S 5/026
USPC ............................. 385/14, 17, 23; 438/31, 69
See application file for complete search history.

(56) References Cited

U.S. PATENT DOCUMENTS

| | | | |
|---|---|---|---|
| 6,904,191 B2 | 6/2005 | Kubby | |
| 6,917,086 B2 | 7/2005 | Cunningham et al. | |
| 7,630,596 B2 | 12/2009 | Watanabe | |
| 7,932,123 B2 | 4/2011 | Rogers et al. | |
| 8,288,185 B2 | 10/2012 | Kim et al. | |
| 8,437,585 B2 | 5/2013 | Na | |
| 2002/0181855 A1* | 12/2002 | Xue et al. | 385/23 |
| 2007/0298551 A1* | 12/2007 | Bouvet et al. | 438/151 |
| 2009/0245298 A1* | 10/2009 | Sysak et al. | 372/22 |
| 2013/0177274 A1 | 7/2013 | Kosenko et al. | |

OTHER PUBLICATIONS

Yao, et al., "Silicon Microtoroidal Resonators With Integrated MEMS Tunable Coupler", IEEE, vol. 13, No. 2, Mar.-Apr. 2007, pp. 202-208.
Lee, et al., "Tunable Coupling Regimes of Silicon Microdisk Resonators Using MEMS Actuators", Optics Express 4703, vol. 14, No. 11, May 29, 2006, 10 pages.

* cited by examiner

*Primary Examiner* — Ellen Kim
(74) *Attorney, Agent, or Firm* — Michael LeStrange; Andrew M. Calderon; Roberts, Mlotkowski, Safran & Cole PC

(57) ABSTRACT

Si waveguide devices on a bulk Si substrate with supporting anchors and methods of manufacture are disclosed. The method includes forming a waveguide device over an Si substrate, and forming one or more anchors from the Si substrate. The one or more anchors support the waveguide device.

20 Claims, 6 Drawing Sheets

US 9,274,277 B2

WAVEGUIDE DEVICES WITH SUPPORTING ANCHORS

FIELD OF THE INVENTION

The invention relates to semiconductor structures and, more particularly, to Si waveguide devices on a bulk Si substrate with supporting anchors and methods of manufacture.

BACKGROUND

Integrated optoelectronic technology allows computing devices to send and receive data at unprecedented speeds. A typical integrated optoelectronic system could include lasers, modulators, multiplexers/demultiplexers, photo-detectors, and other passive components such as filters, couplers and waveguides.

Silicon photonics use silicon as an optical medium. The silicon is patterned with sub-micrometre precision, into microphotonic components used in fiber optic telecommunication systems. Silicon photonic devices can be made using existing semiconductor fabrication techniques, and because silicon is already used as the substrate for most integrated circuits, it is possible to create hybrid devices in which the optical and electronic components are integrated onto a single microchip.

In some implementations, silicon photonics rely on SOI wafers to create passive optical waveguides. While SOI based waveguides provide a strong confinement of optical field and the ease of integration with other optical/electrical components, it is not without tradeoffs. For example, the cost of SOI processes is substantially higher than Si processes, including both substrate and fabrication expenses. Also, the buried oxide in SOI tends to block excess heat that is inevitably generated by the optical/electrical components, and therefore may feature poor thermal conductivity and stability. For these reasons, many foundries still implement optical waveguide devices in bulk Si. However, it has been found that long Si waveguides can swing out of position, thus affecting the efficiency of waveguide transmission.

SUMMARY

In an aspect of the invention, a method comprises forming a waveguide device over a Si substrate, and forming one or more anchors from the Si substrate. The one or more anchors support the waveguide device.

In an aspect of the invention, a method comprises forming a waveguide device over a Si substrate. The waveguide device is formed by: forming an SiGe material on the Si substrate; forming a Si material on the SiGe material; forming shallow trench isolation structures in the Si material; forming an oxide material on the Si material; forming a sacrificial material on the oxide material; forming trenches into the Si substrate; forming a cavity in the Si substrate by an etching process in a <100> etch direction through the trenches, wherein the SiGe material acts as an etch stop layer to form an Si waveguide device; removing the oxide material and the sacrificial material; and partially filling the cavity with an insulator material. The method further comprises forming one or more anchors from the Si substrate, which contact and support the waveguide device. The one or more anchors are formed from the Si substrate and have an edge formed in a <110> direction.

In an aspect of the invention, a structure, comprises: a bulk silicon substrate; a curved silicon waveguide device formed with an epitaxial layer grown above the bulk silicon substrate; and a plurality of anchors supporting the curved silicon waveguide device, the plurality of anchors formed from bulk silicon substrate.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the anchors for Si waveguide devices on a bulk Si substrate, which comprises the structures of the present invention. In still further embodiments, a method in a computer-aided design system is provided for generating a functional design model of the anchors for Si waveguide devices on a bulk Si substrate. The method comprises generating a functional representation of the structural elements of the anchors for Si waveguide devices on a bulk Si substrate.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
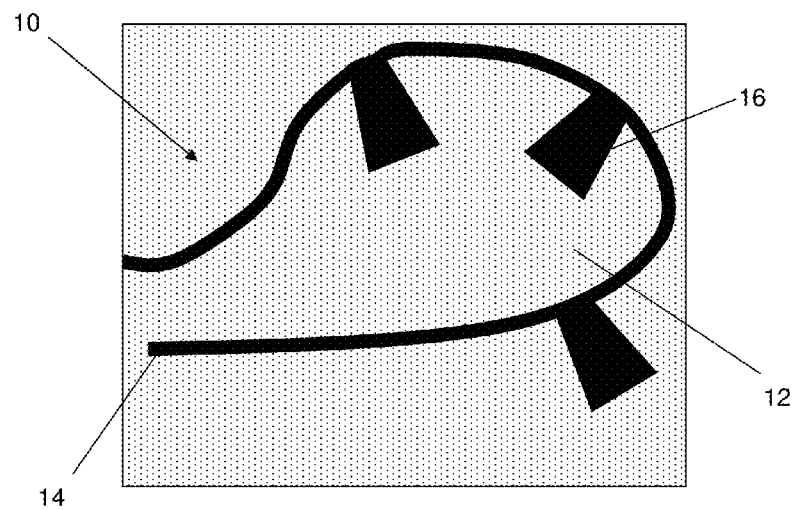
FIG. 1 shows a structure and respective processing steps in accordance with aspects of the present invention.

The invention relates to semiconductor structures and, more particularly, to Si waveguide devices on a bulk Si substrate with supporting anchors and methods of manufacture. More specifically, the present invention is directed to an Si anchor directly underneath the waveguides, with or without dataprep. In further embodiments, the Si anchor can be provided at predetermined locations underneath or on the sides of the waveguide device. In any of the embodiments, advantageously, the present invention provides the ability to fabricate waveguide devices on a bulk Si substrate at lower costs and with higher integration compared to conventional structures. For example, by implementing the structures and processes of the present invention it is now possible to integrate very high-speed SiGeHBT devices to drive waveguides, detectors, modulators, etc.

In embodiments, the present invention can be implemented in a photonic structure. The structure comprises, for example, a bulk silicon substrate with a curved silicon waveguide structure formed with an epitaxial layer grown above the bulk silicon substrate. A plurality of anchors support the curved silicon waveguide structure, formed using a crystallographic etching process in the bulk silicon substrate in a <110> direction such that each one of the plurality of anchors forms a single point of contact under the curved silicon waveguide structure to minimize optical losses.

In one illustrative example, the method of manufacturing a plurality of anchor structures is provided directly underneath a Si waveguide structure on a bulk Si substrate at one or more selected locations. The method comprises, for example, growing a layer of SiGe on a substrate, and forming a silicon waveguide structure on the SiGe layer. The Si layer can be formed by a growth process for the waveguide device. After oxide deposition, a sacrificial layer deposition is performed, e.g., a-Si, SiGe or Ge or SiN. A photolithographic process is then performed using, for example, a SiN mask. A non-selective SiGe/oxide/Si (SOS) etch and resist strip can be performed to form trenches, hence forming anchor structures. In embodiments, the method comprises adding shapes with <110> edges at pre-determined anchor locations to build a pair of anchors at sides of waveguide devices. The method also uses a SiGe etch stop layer to build Si waveguide devices. The method can also use selected anchors as contacts to a waveguide modulator, for example.

The anchors for Si waveguide devices of the present invention can be manufactured in a number of ways using a number of different tools. In general, though, the methodologies and tools are used to form structures with dimensions in the micrometer scale. The methodologies, i.e., technologies, employed to manufacture the anchors for Si waveguide devices of the present invention have been adopted from integrated circuit (IC) technology. For example, the structures of the present invention are built on wafers and are realized in films of material patterned by photolithographic processes on the top of a wafer. In particular, the fabrication of the anchors for Si waveguide devices of the present invention uses three basic building blocks: (i) deposition of thin films of material on a substrate, (ii) applying a patterned mask on top of the films by photolithographic imaging, and (iii) etching the films selectively to the mask.

FIG. 1 shows a structure and respective processing steps in accordance with aspects of the present invention. In particular, FIG. 1 shows a structure 10 comprising a waveguide device 14 formed on a bulk substrate 12, with anchors 16 directly underneath the waveguide device 14. The structure 10 of FIG. 1 can be fabricated using conventional fabrication processes, e.g., deposition, lithography and etching.

Specifically, in embodiments, a SiGe layer can be deposited on a bulk Si substrate 12 using conventional deposition processes, e.g., chemical vapor deposition. The SiGe layer can be used to partially form the core of the waveguide device 14. A photoresist is deposited on the SiGe layer and patterned by exposure to energy (light). In embodiments, the pattern is a circular shape. An etch process, e.g., reactive ion etch (RIE), is performed on the SiGe layer to form the waveguide device 14, e.g., Si/SiGe waveguide core, in a circular or curved shape. It should be understood by those of skill in the art that any waveguide shape can be implemented with the anchors of the present invention. In embodiments, etching is performed in the <100> direction. Thereafter, a timed isotropic etch is performed to form undercuts underneath the waveguide device 14, leaving the anchors 16 directly underneath the waveguide device 14. The anchors 16 can be performed at one or more locations underneath the waveguide device 14. This etching process can be performed using, for example, ammonia hydroxide, as an example. The resist can be removed using a conventional oxygen ashing process.

Figure 2:
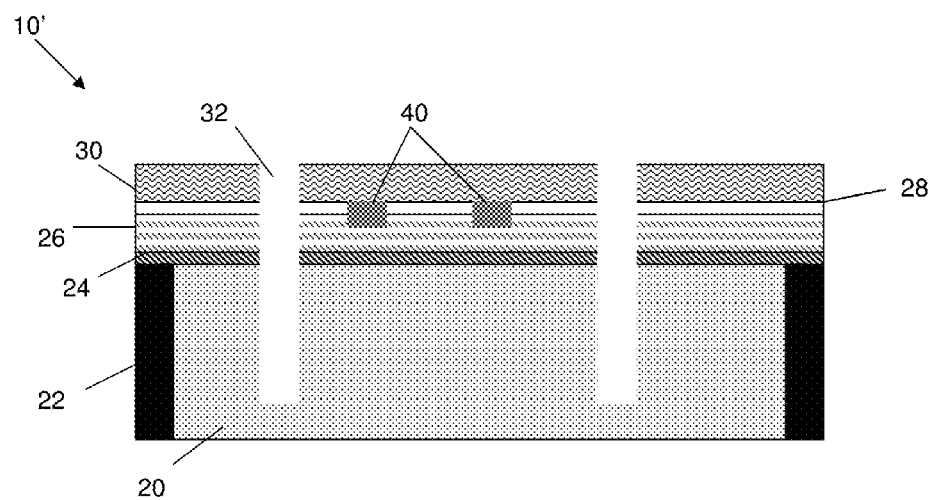
FIGS. 2-9 show structures and respective processing steps in accordance with additional aspects of the present invention.

FIGS. 2-9 show structures and respective processing steps in accordance with additional aspects of the present invention. In FIG. 2, the structure 10' includes a Si substrate 20, with deep trench isolation structures 22. The Si substrate 20 can be a single crystalline Si substrate. In embodiments, the isolation structures 22 are $SiO_2$ structures formed using conventional lithography, etching and deposition methods such that further explanation is not required for an understanding of the present invention. A SiGe layer 24 is deposited on the substrate 20. In embodiments, the SiGe layer 24 can be deposited by an epitaxial growth process, e.g., chemical vapor deposition (CVD) or low pressure CVD (LPCVD), to a thickness of about 200 Å; although other dimensions are also contemplated by the present invention. In embodiments, the SiGe layer 24 is formed by a single crystalline epitaxial growth process. The SiGe layer 24 can include about 20% to 40% of Ge, depending on the particular parameters of the waveguide device.

Still referring to FIG. 2, a Si layer 26 is formed on the SiGe layer 24. The Si layer 26 can be deposited to a thickness of about 2000 Å; although other dimensions are also contemplated by the present invention. In embodiments, the Si layer 26 can be patterned (using conventional lithography and etching processes) to form a waveguide device as described herein. An oxide layer 28 is formed on the Si layer 26, using conventional deposition processes, e.g., chemical vapor deposition processes. In embodiments, the oxide layer 28 can be about 100 Å thick; although other dimensions are also contemplated by the present invention. Shallow trench isolation structures 40 can be formed in the oxide layer 28 and the Si layer 26. As further discussed herein, the oxide layer 28 can be removed at a later fabrication step, thereby leaving the shallow trench isolation structures 40 partly formed in the Si layer 26 to isolate the waveguide device.

A sacrificial layer 30 is formed on the oxide layer 28. In embodiments, the sacrificial layer 30 can be, for example, SiN, polysilicon, amorphous silicon, Si or SiGe. A trench 32 is formed in the structure, preferably extending into the substrate 20. In embodiments, the trench 32 is formed using conventional lithography and etching processes, where the etching is performed in the <100> direction.

Figure 3:
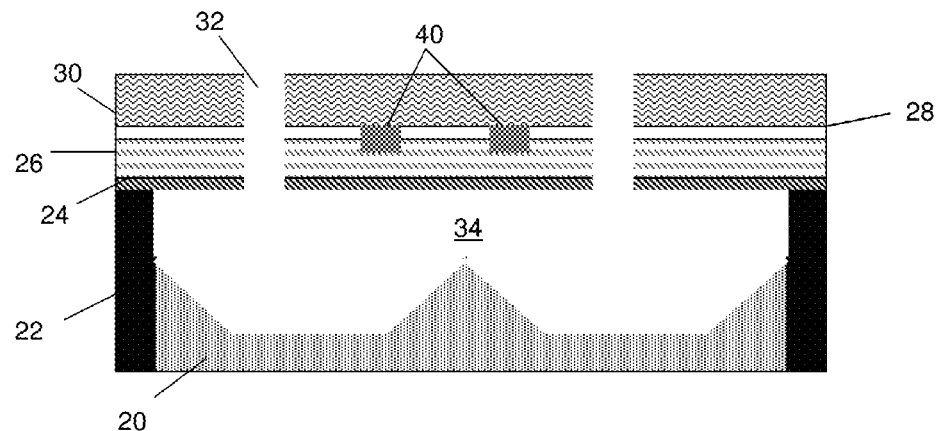

In FIG. 3, an undercut etching process is performed to form a cavity 34. In embodiments, the undercut etching process is performed in the <100> direction. As should be understood by those of skill in the art, the <100> direction etch process is a fast etch, thereby forming the cavity 34, e.g., removal of portions of the substrate 20 under the SiGe layer 24. The SiGe layer 24 can act as an etch stop layer to build a Si waveguide device.

Figure 4:
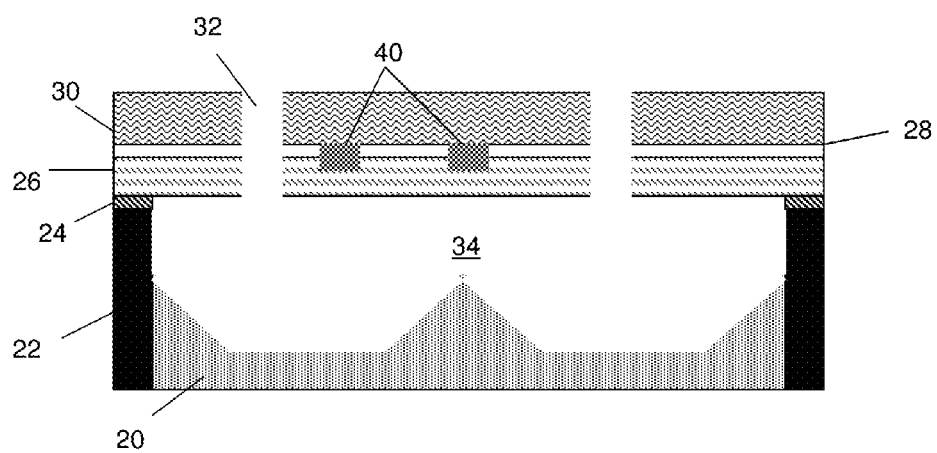

In an optional step shown in FIG. 4, the SiGe layer 24 can be removed from a top portion of the cavity 34, by an isotropic RIE process selective to the SiGe material. It should be understood by those of skill in the art that the undercut etch could also etch the Si layer 26 above the SiGe etch stop layer 24. It should further be understood that the formation of a dielectric sidewall spacer for the Si layer 26 can be added to the process flow in order to protect the Si layer 26 during the etching.

Figure 5:
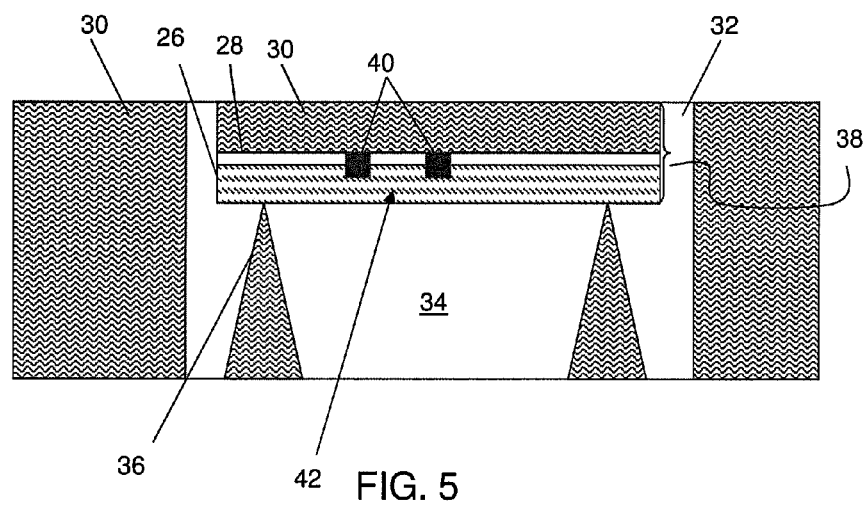
Figure 6:
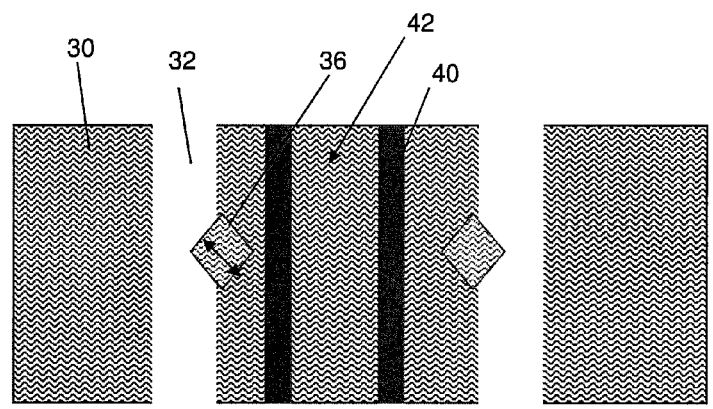

FIG. 5 shows a cross-sectional view of the structures of FIGS. 3 and 4, rotated 90°. FIG. 6 shows a top view of the structure of FIG. 5. More specifically, FIGS. 5 and 6 show anchor points 36, formed in the <110> direction (e.g., edges are formed in <110> directions represented by the arrow on the anchor point 36 in FIG. 6). As shown in FIG. 5, the anchor points 36 support an island 38, e.g., layers 26, 28 and 30. As should be understood by those of skill in the art, a portion of the island 38 will form the waveguide device 42. Accordingly, the anchor points 36 will be provided on sides of the waveguide device 42.

Figure 7:
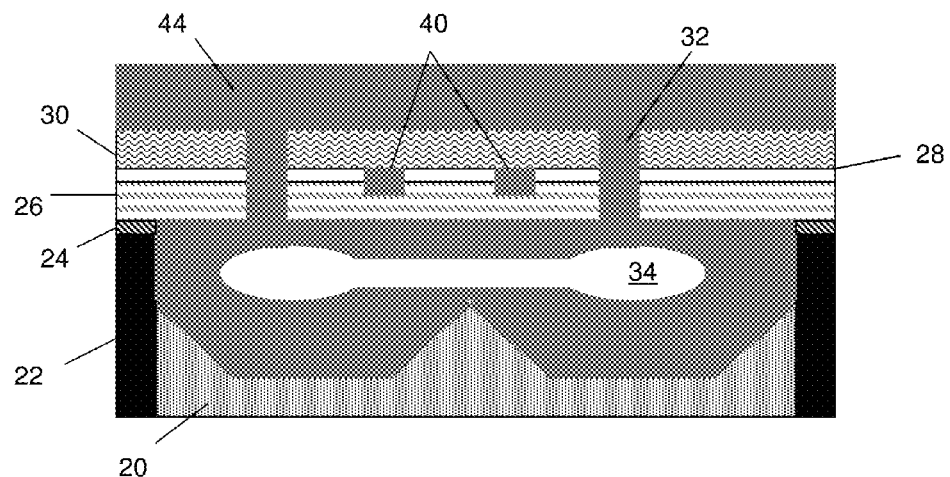

In FIG. 7, the cavity 34 is partially filled with an oxide or other insulator material 44. In embodiments, the cavity 34 is filled by an oxide deposition, which pinches off a cavity opening, e.g., trenches 32. During this deposition process, oxide material can also be formed on an upper surface of the sacrificial layer 30.

Figure 8:
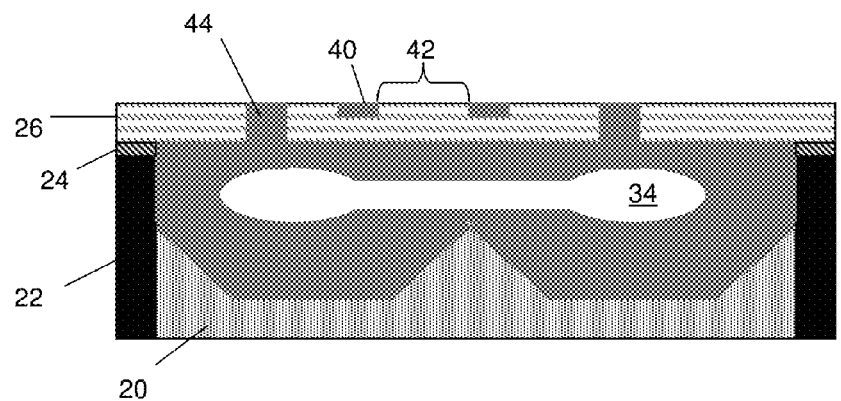

In FIG. 8, the oxide layer 44 can be removed from the top surface of the sacrificial layer 30. The sacrificial layer 30 can then be removed, as well as the oxide layer 28. The oxide layer 44, sacrificial layer 30 and oxide layer 28 can be removed by conventional selective etch processes. In this way, the Si waveguide device 42 can be formed from the Si layer 26. In an alternative approach, starting from FIG. 3, the waveguide device 42 can be formed from the SiGe layer 24 and the Si layer 26. In either scenario, the anchor points 36 are in contact with and support the waveguide device 42, e.g., waveguide modulator.

Figure 9:
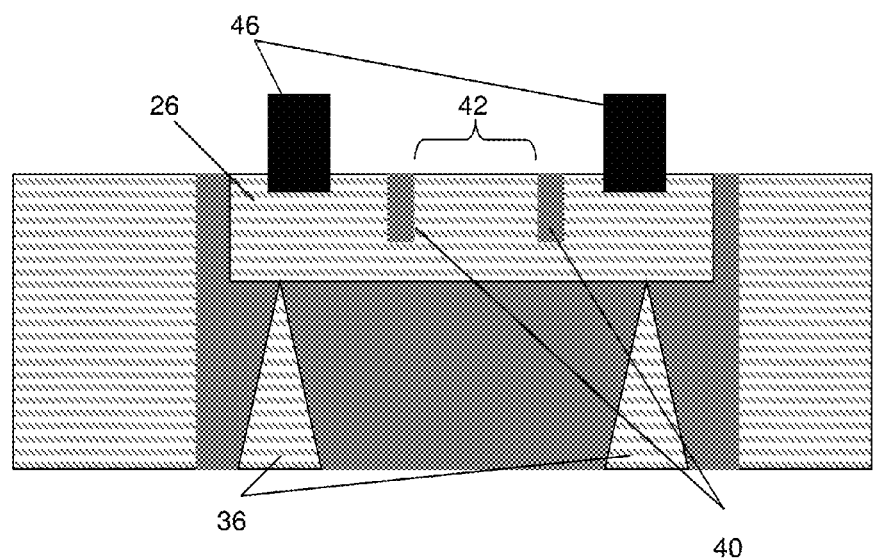

FIG. 9 shows a cross-sectional view of the structure of FIG. 7, rotated 90°. More specifically, FIG. 9 shows the anchor points 36 supporting the waveguide device 42 (formed from the Si layer 26), formed between the trenches 32. As shown in FIG. 9, the anchor points 36 are supporting the waveguide device 42 on its sides. P and N contacts 46 are also formed on sides of the waveguide device 42, using conventional deposition, e.g., deposition of metal or metal alloy (tungsten), and etching processes.

Figure 10:
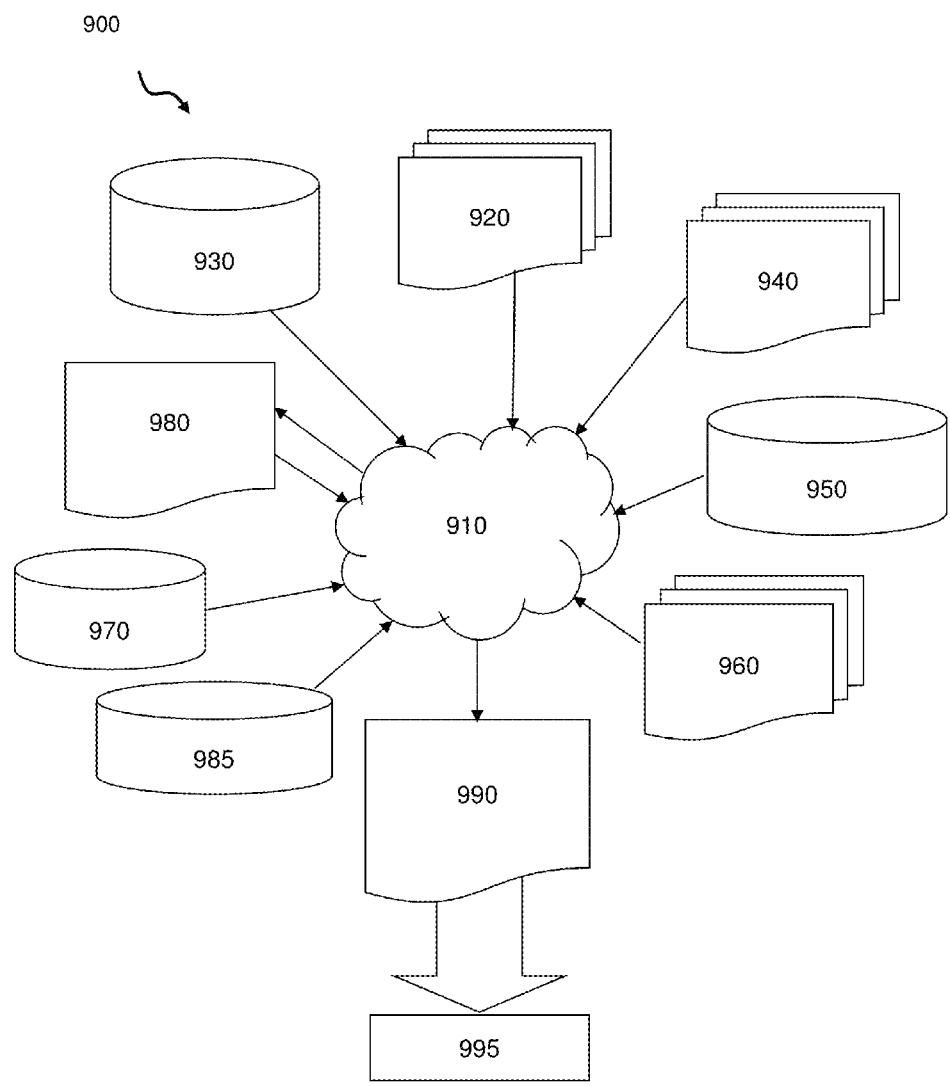
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a waveguide device over an Si substrate; and
    forming one or more anchors from the Si substrate, which support the waveguide device, wherein the forming of the waveguide device comprises the steps of:
        forming an SiGe material on the Si substrate;
        forming a Si material on the SiGe material;
        forming shallow trench isolation structures in the Si material;
        forming an oxide material on the Si material;
        forming a sacrificial material on the oxide material;
        forming trenches into the Si substrate, through the Si material, SiGe material, oxide material and sacrificial material;
        forming a cavity in the Si substrate by an etching process through the trenches;
        partially filling the cavity and pinching off the trenches with an insulator material;
        removing the insulator material over the sacrificial material in areas outside the trenches; and
        removing the oxide material and the sacrificial material.

2. The method of claim 1, wherein the waveguide device is formed from the Si material over the cavity formed in the Si substrate.

3. The method of claim 1, wherein the waveguide device is formed from the Si and SiGe material over the cavity formed in the Si substrate.

4. The method of claim 1, wherein the one or more anchors are formed directly underneath the waveguide device.

5. The method of claim 1, wherein the one or more anchors are formed on sides of underneath the waveguide device.

6. The method of claim 1, wherein the one or more anchors have edges formed in a <110> direction and the waveguide device is formed from initially a <100> etch direction.

7. The method of claim 1, wherein the forming of the one or more anchors comprises etching a bulk Si substrate.

8. The method of claim 1, wherein the forming of the waveguide device further comprises removing the SiGe material within the cavity to form a Si waveguide device.

9. The method of claim 1, wherein the forming of the one or more anchors is formed during the formation of the cavity.

10. The method of claim 9, wherein the one or more anchors are formed with edges in a <110> direction.

11. The method of claim 10, wherein the cavity is initially formed by an undercut etching process performed in a <100> direction.

12. The method of claim 1, wherein the SiGe material is deposited by a single crystalline epitaxial growth process.

13. The method of claim 1, wherein the one or more anchors are a pair of anchors, each of which is formed on a side of the waveguide device.

14. A method, comprising:
    forming a waveguide device over a Si substrate, the forming of the waveguide device comprising:
        forming an SiGe material on the Si substrate;
        forming a Si material on the SiGe material;
        forming shallow trench isolation structures in the Si material;
        forming an oxide material on the Si material;
        forming a sacrificial material on the oxide material;
        forming trenches into the Si substrate;
        forming a cavity in the Si substrate by an etching process initially in a <100> etch direction through the trenches, wherein the SiGe material acts as an etch stop layer to form an Si waveguide device;
    partially filling the cavity with an insulator material;
    removing the insulator material over the sacrificial material in areas other than the trenches;
    removing the oxide material and the sacrificial material; and
    forming one or more anchors from the Si substrate, which contact and support the waveguide device, the one or more anchors being formed from the Si substrate and having an edge formed in a <110> direction.

15. The method of claim 14, wherein the waveguide device is formed from Si material.

16. The method of claim 14, wherein the waveguide device is formed from SiGe material.

17. The method of claim 14, wherein the one or more anchors are formed on sides of the waveguide device.

18. The method of claim 15, wherein the one or more anchors are formed directly underneath the waveguide device.

19. A structure, comprising:
a bulk silicon substrate;
a curved silicon waveguide device formed with an epitaxial layer grown above the bulk silicon substrate; and
a plurality of anchors supporting the curved silicon waveguide device, the plurality of anchors formed from bulk silicon substrate.

20. The structure of claim 19, wherein the silicon waveguide device further comprises:
an SiGe material on the bulk silicon substrate;
a Si material on the SiGe material;
a plurality of shallow trench isolation structures in the Si material;
an oxide material on the Si material;
a sacrificial material on the oxide material;
a plurality of trenches into the bulk silicon substrate, through the epitaxial layer, the Si material, the SiGe material, the oxide material and the sacrificial material; and
a cavity in the Si substrate filled with an insulator material.

* * * * *